United States Patent [19]

Grabbe

[11] 4,079,511
[45] Mar. 21, 1978

[54] METHOD FOR PACKAGING HERMETICALLY SEALED INTEGRATED CIRCUIT CHIPS ON LEAD FRAMES

[75] Inventor: Dimitry G. Grabbe, Lisbon Falls, Me.

[73] Assignee: AMP Incorporated, Harrisburg, Pa.

[21] Appl. No.: 710,043

[22] Filed: Jul. 30, 1976

[51] Int. Cl.² ............................................. H05K 3/28
[52] U.S. Cl. ................................ 29/627; 174/52 PE; 174/52 FP
[58] Field of Search ................. 29/627, 626, 577, 588, 29/589; 174/68.5, 52 PE, 52 S, 52 FP, 52 R; 317/101 A, 101 CP

[56] References Cited

U.S. PATENT DOCUMENTS

| | | | |
|---|---|---|---|
| 3,509,430 | 4/1970 | Mroz | 174/52 FP X |
| 3,627,901 | 12/1971 | Happ | 174/52 PE |
| 3,763,404 | 10/1973 | Aird | 174/52 PE X |
| 3,767,839 | 10/1973 | Beal | 174/52 FP |
| 3,778,685 | 12/1973 | Kennedy | 174/52 FP X |
| 3,802,069 | 4/1974 | Thompson | 29/627 |
| 3,832,480 | 8/1974 | Bunker | 174/52 FP |

*Primary Examiner*—Lowell A. Larson
*Attorney, Agent, or Firm*—Donald W. Phillion; William J. Keating; Jay L. Seitchik

[57] ABSTRACT

An assembly line method for fabricating hermetically sealed integrated circuit chips with externally extending terminal leads comprising the steps of securing at least one integrated circuit chip upon a spider assembly; stamping a strip of iterative lead frame assemblies from a strip of flat stock metal; encapsulating each of said lead frame assemblies with plastic in a configuration which leaves a window space in the center thereof or defined elsewhere therein, with the convergent ends of the individual conductive paths of the lead frame extending out of the plastic and into said window space, and the divergent ends of such conductive paths extending out of the plastic and away from the window space; mounting the terminal chip holding spider assembly onto the convergent ends of the conductive paths of the lead frame; inserting a first cap over the window space on one side of the encapsulating plastic; filling the window space with a sealant to completely immerse said spider bearing chip therein and having the properties of being electrically insulative and virtually completely resistant to the passage of moisture therethrough; and inserting a second cap over said window space on the other side of said encapsulating plastic to completely seal said spider bearing chip therebetween in said sealant.

13 Claims, 14 Drawing Figures

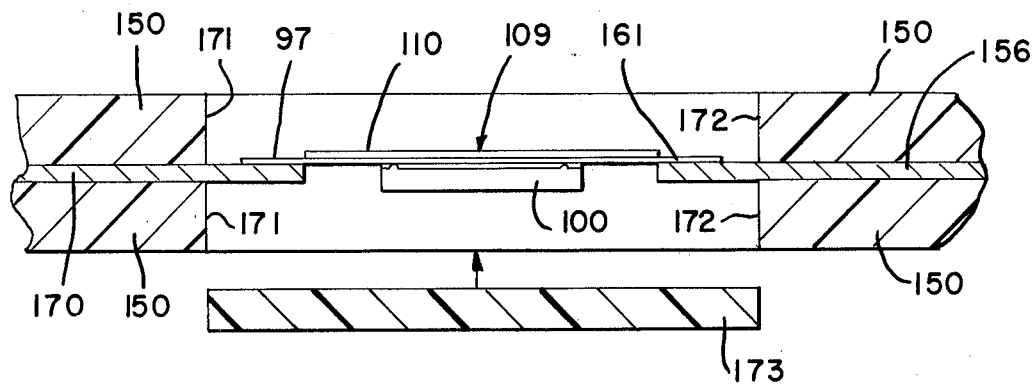
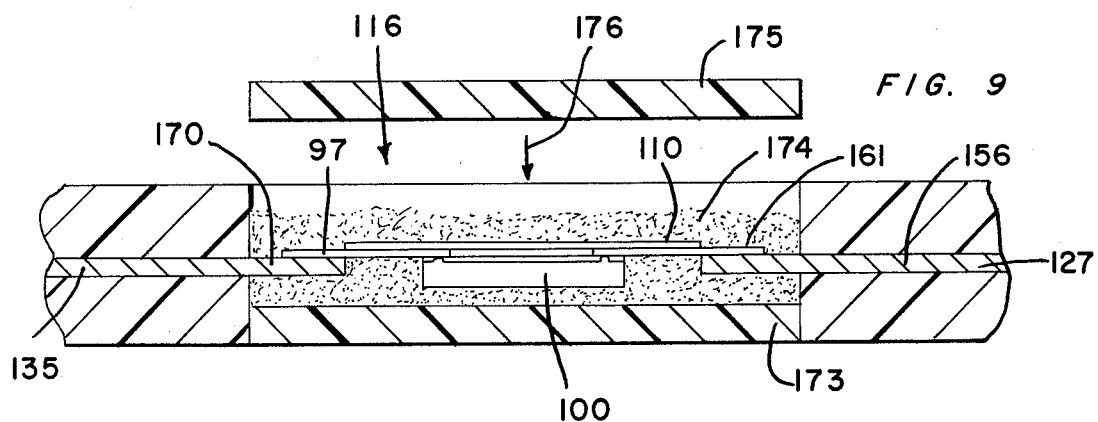
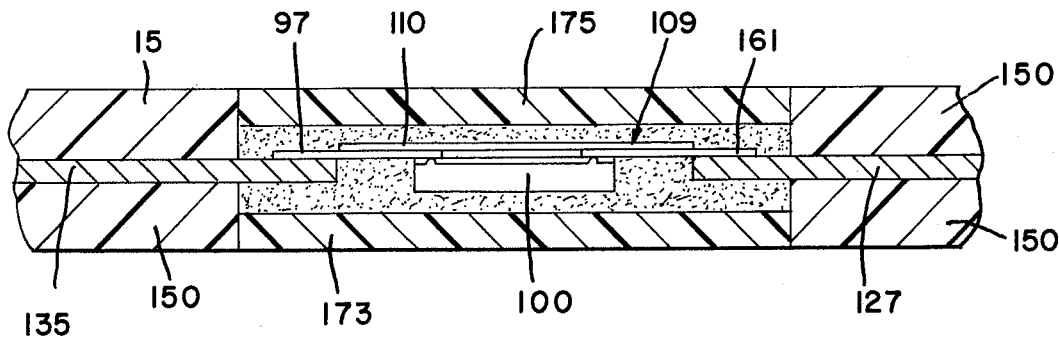

METHOD FOR PACKAGING HERMETICALLY SEALED INTEGRATED CIRCUIT CHIPS ON LEAD FRAMES

BACKGROUND OF THE INVENTION

This invention relates to a method for fabricating packaged circuit units containing hermetically sealed integrated circuit chips having externally extending lead frame terminals, and more particularly the invention relates to a fast, reliable method for fabricating such hermetically sealed units in strip form on an assembly line basis.

In one method currently employed for fabricating such packaged circuits the terminal pads of the integrated circuit chips are first secured to the converging ends of a converging pattern of conductive paths known in the art as a spider lead assembly which has been formed previously on a suitable tape material, such as Kapton tape or it can be formed by etching or stamping from a solid sheet of metal. A portion of the acetate tape containing one of the chip-supporting spider assemblies is separated from the tape and mounted in a lead frame structure which is stamped iteratively in a strip from flat metal stock. The conductive paths of the spider are bonded, usually by thermocompression bonding, soldering, brazing or other suitable means for joining metals together conductively, to those ends of the conductive paths or terminals of the lead frame which converge towards a common opening within which the chip supporting spider assembly is positioned. The resulting structure is one in which the small and delicate terminal pads on the edge of the integrated circuit chip are connected to the converging ends of the conductive paths of the spider assembly, and the diverging ends of the conductive paths of the spider assembly are in turn connected to the converging ends of the lead frame conductive paths, also referred to herein as the lead frame terminals. The resulting structure is then encapsulated in plastic in such a manner that the second (divergent) ends of the lead frame terminals extend out of the plastic for connection into a circuit board, or other suitable terminating means. The diverging ends of the lead frame terminals can later be connected directly into a circuit board, for example.

One problem experienced with the foregoing method arises from the fact that the molten plastic comes into physical contact with the integrated circuit chip when encapsulation occurs. Because of the heat and also because of possible chemical reaction between the plastic and the chip, only limited types of plastic can be employed. Such plastics include certain epoxys and certain high quality silicone resins, both of which are thermal setting, which means that a considerable period of time is needed for the molten plastic to become sufficiently hard for handling purposes. Further, these epoxys and silicone resins are expensive and, because of their thermal setting characteristics, the scrap material cannot be reused. When millions of circuit packages are fabricated the cost of the unuseable material becomes quite substantial. A 50 percent loss is common.

A further disadvantage of the above-described prior art method of production is that it is limited to batch processing rather than a continuous assembly line type of processing. Batch processing, which consists of "sticks" of the circuit packages being processed on an individual basis, is relatively slow and costly.

In another prior art method employed today the lead frame structures are iteratively stamped from a strip of metal with the same general configuration as the lead frame configuration described above, that is, with the first free ends thereof converging around the edges of an open area and having second free ends which extend away from said open area in a generally divergent pattern. The portions of the lead frame terminals between the convergent and divergent ends thereof are encapsulated in plastic to form a plastic frame defining a window around said open area with the convergent ends of the lead frame terminals extending out of the inner edges of the plastic frame and into said window area, and with the diverging ends of the lead frame terminals extending out of the outer edges of the plastic frame.

Because the molten plastic does not come in contact with the integrated circuit chips, the lead frames can be encapsulated with inexpensive plastics which harden very rapidly thus permitting rapidly incremented or continuous assembly line procedures for the fabrication of the premolded plastic lead frames which occurs prior to the addition of the spider and circuit chip to the assembly.

In this last-mentioned method the individual integrated circuit chips are brazed onto a relatively heavy metal cap, or cover, plated with gold or silver and the resulting assembly then glued within the window formed by the plastic frame. The chip itself should be backed with a suitable material such as gold or other noble metal to permit brazing onto the gold or sliver plated cap.

Next, the small, raised terminal pads on the edge of the integrated circuit chip are connected to the gold or silver plated free ends of the lead frame terminals, which must be plated with a noble metal such as gold or silver, by small gold or aluminum wires individually connected between the terminals of the circuit chip and the lead frame terminals.

Finally, the window space is filled with a suitable sealant such as a silicone gel. The sealant completely surrounds the integrated circuit chip and substantially completely fills the window space. A second cap is then glued over the still open side of the window space to hold the sealant therein. The sealant should have chemical properties of relatively low molecular cross-linking to avoid penetration of moisture therethrough and onto the surface of the integrated circuit chip.

A major problem of the last-mentioned method is that about 300 milliseconds are required to bond or terminate one end of one of the fine wires. If there are 14 such fine wires the total time for securing the fine wires between the chips and the lead frame terminals is usually at the rate of about 29 bonds per minute.

BRIEF STATEMENT OF THE INVENTION

It is a primary object of the invention to provide a method of fabricating circuit packages containing hermetically sealed integrated circuit chips on an assembly line basis wherein the amount of time required to fabricate each package is of the order of 200 milliseconds.

It is a further object of the invention to provide a fast and reliable method of fabricating packaged circuits containing integrated circuit chips in which fast setting and reuseable plastic is employed.

It is a third aim of the invention to provide a method of encapsulating integrated circuit chips connected to lead frames by spider assemblies without the molten plastic ever contacting the surface of the integrated circuit chip.

Another object of the invention is to provide a method for fast assembly line production of plastic encapsulated circuits including integrated circuit chips and in which the plastic never touches the chip.

Yet another purpose of the invention is a method of fabricating packaged circuits each including at least one integrated circuit chip, one lead frame and at least one spider assembly for connecting at least one integrated circuit chip to the lead frame and with a plastic frame encapsulating portions of the lead frame in a manner to define window spaces within which first ends of the lead frame extend to provide a mounting means for the chip containing spider, and with said window space being filled with a hermetically sealing gel contained within caps enclosing both sides of said window space.

A still further object of the invention is an assembly line method for fabricating a strip of integrated circuits mounted on spiders which are in turn mounted upon lead frame terminals held together by a plastic frame and without having physical contact between the plastic and the integrated circuit chips.

Another aim of the invention is a packaged circuit containing an integrated circuit chip formed by the method described herein.

In accordance with one form of the present invention the process comprises, and the product of such process is formed by, the steps of stamping the lead frames iteratively from a continuous strip of metal with first ends of lead frame terminals of each lead frame structure converging and terminating around the edge of an open area and with the second ends of said lead frame terminals extending outwardly in a generally divergent manner away from said open area; encapsulating with plastic that portion of the terminals of each lead frame structure between the first and second ends thereof to form a plastic frame defining a window around said open area with the first ends of said lead frame terminals extending in a convergent manner out of said plastic into said window space and with the second ends of the lead frame terminals extending in a divergent manner out of said plastic away from the window space; mounting an integrated circuit chip upon a spider lead assembly with the terminals of the integrated circuit chip connected to converging first ends of the separate conductive paths of the spider assembly; connecting the diverging second ends of the conductive paths of said spider assembly to the diverging ends of the lead frame terminals of a lead frame; securing a first cap over said window space on a first side of the plastic frame; filling the window space with a sealant; and securing a second cap over said window space on the second side of said plastic frame.

In accordance with a modification of the invention the lead frame structure has a reference potential plate formed from the lead frame material and positioned in the open area at the convergent ends of the terminals. The integrated circuit chip is mounted within the window space defined by the plastic frame and upon the reference potential plate which, in most instances, is ground potential. A conductor, also formed from the lead frame material, extends through and external to the plastic frame and is connectable to a suitable reference potential which usually is ground.

It is further within the scope of this invention that two circuit chips can be mounted on the reference potential plate, one on either side thereof, with each circuit chip connected to the lead frame terminals by separate spider assemblies. The steps of capping the window space on one side of the plastic frame, filling the window space with a moisture proof sealant, and then capping the window space on the other side of the plastic frame is the same as was discussed above.

It is a feature of the invention that all of the foregoing steps can be performed on a continuously moving assembly line on a reel to reel basis.

BRIEF DESCRIPTION OF THE DRAWINGS

FIG. 8 is a sectional view of the structure being fabricated and shows the step of inserting a cap in the window space formed in the encapsulating plastic of the structure and in which window space is mounted the chip holding spider assembly;

FIG. 9 is another sectional view of the structure being fabricated and shows the filling of the window space around the chip holding spider assembly and the convergent ends of the lead frame terminals after the bottom cap has been inserted and also shows the insertion of a cap on the top side thereof to completely seal the chip holding spider therebetween;

FIG. 10 is a sectional view of the entire structure in its completed form;

DETAILED DESCRIPTION OF THE INVENTION

This specification is organized in the following manner:

I. DISCUSSION OF FLOW CHART OF PROCESS OF FIG. 1

II. FABRICATION AND DESCRIPTION OF THE INTEGRATED CIRCUIT CHIPS OF FIG. 2

III. FABRICATION AND DESCRIPTION OF THE SPIDER ASSEMBLY OF FIG. 3

Figure 5:
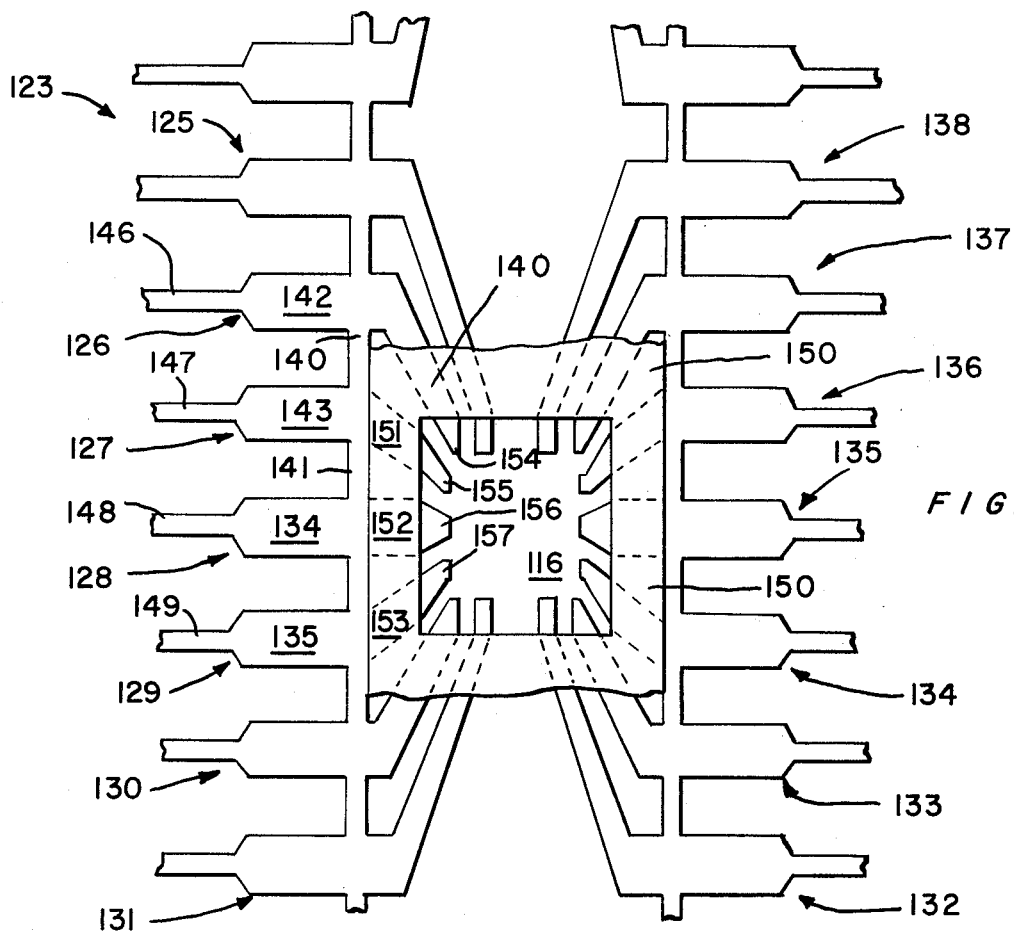
FIG. 5 shows a lead frame encapsulated in plastic prior to the installation therein of an integrated circuit chip-supporting spider assembly.

IV. FABRICATION OF THE LEAD FRAME STRUCTURES AND THE SELECTIVE ENCAPSULATION THEREOF WITH PLASTIC AS SHOWN IN FIG. 5

Figure 6:
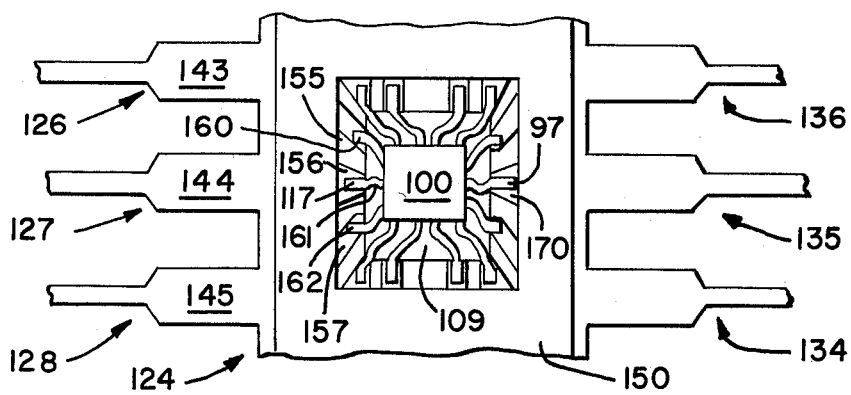
FIG. 6 shows the structure formed by the method of the present invention after the spider-supporting chip has been installed in the previously plastic encapsulated lead frame.
Figure 7:
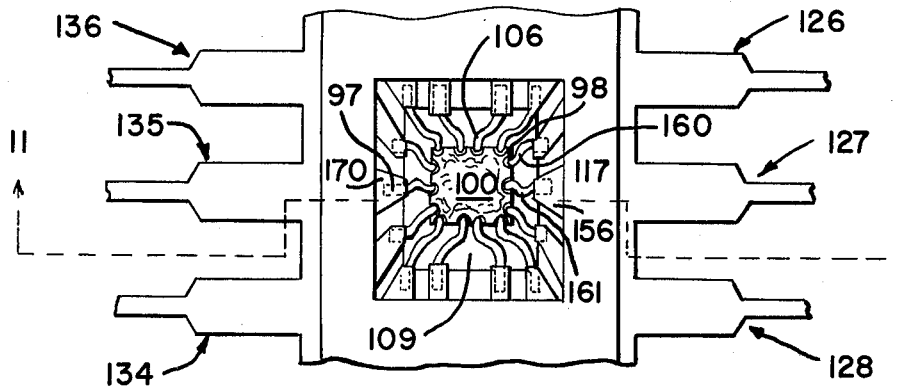
FIG. 7 shows the structure of FIG. 6 viewed from the opposite side.

V. METHOD OF SECURING A SPIDER ASSEMBLY HAVING AN INTEGRATED CIRCUIT CHIP MOUNTED THEREON ONTO THE ENDS OF THE TERMINALS OF A LEAD FRAME AS SHOWN IN FIGS. 6 AND 7

VI. ASSEMBLY OF THE BOTTOM CAP, THE SEALANT, AND THE TOP CAP INTO THE WINDOW SPACE DEFINED BY THE ENCAPSULATING PLASTIC AS SHOWN IN FIG. 8

VII. MODIFIED METHOD EMPLOYING A LEAD FRAME STRUCTURE WHICH INCLUDES A REFERENCE POTENTIAL PLANE UPON WHICH THE INTEGRATED CIRCUIT CHIP CAN BE MOUNTED AND DISCUSSION OF TYPICAL PRODUCTS MADE THEREWITH

I. DISCUSSION OF FLOW CHART OF PROCESS OF FIG. 1

Figure 1:
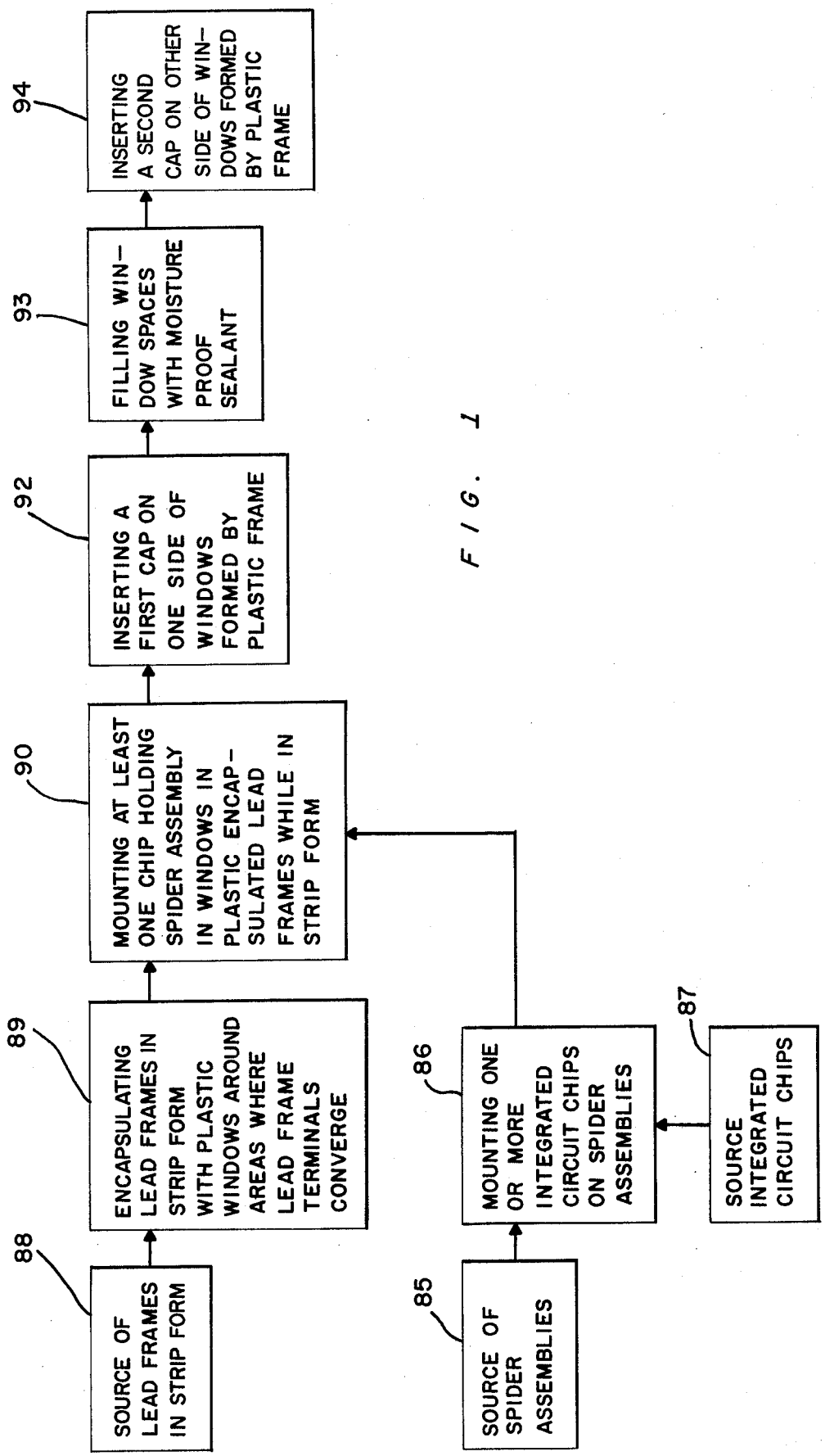
FIG. 1 is a flow chart of the process of the invention.

Before discussing each step of the process in detail, a general discussion of the overall process, with the aid of the flow chart of FIG. 1 will be set forth first.

In FIG. 1 block 85 represents a source of spider assemblies (shown in FIG. 3) including the processes and equipment required to produce completed spider assemblies. Block 87 represents a source of integrated circuit chips (shown in FIG. 2) and the facilities needed to produce such chips. Block 86 represents the equipment and processes required to mount the integrated circuit chips upon the spider assemblies.

The circuit chip carrying spider assemblies (shown in FIG. 4) are then ready to be mounted onto a lead frame structure in a step indicated by block 90. Prior processing of the lead frame structures has been indicated in blocks 88 and 89. Specifically, block 88 represents the step of fabricating lead frames in strip form and block 89 represents the encapsulation of the lead frames in strip form with plastic in such a manner as to define windows around the convergent ends of the conductive paths of the lead frame structures (shown in FIG. 6).

In block 90 the integrated circuit chip carrying spider assemblies are mounted upon the converging ends of the lead frame conductive paths within the window of the encapsulating plastic (shown in FIG. 7).

In block 92 a first cap is inserted in the window on one side of the plastic frame by means of press fitting or gluing, (as shown in FIG. 10, for example). Next, in block 93 the space defined by the plastic window and the first cap already inserted therein is filled with a suitable sealant (as shown in FIG. 10), such as a silicone gel, which is a polymer having a molecular structure with relatively little molecular cross-linking, thereby providing a high degree of imperviousness to penetration of gases or moisture therethrough.

Figure 11:
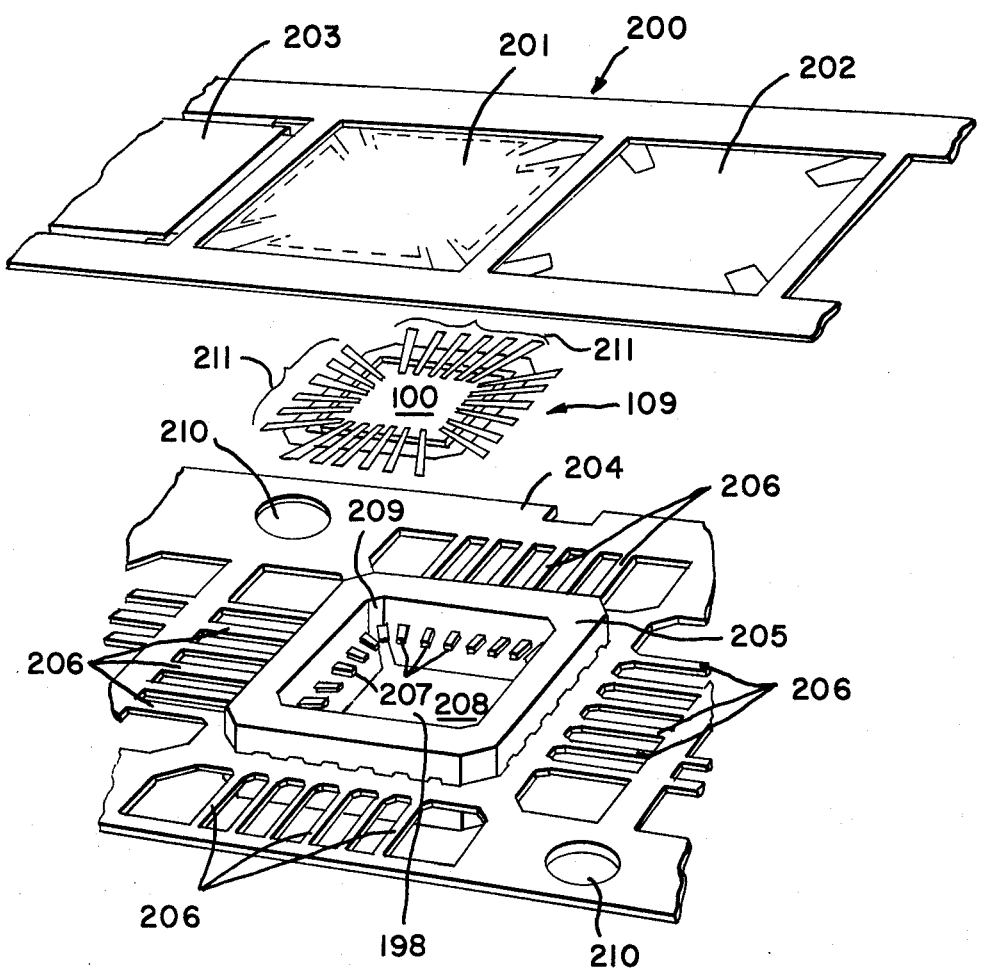
FIG. 11 is a perspective view of one step of a modified process showing the connection of the spider assembly with a chip mounted thereon upon the lead frame terminals extending into the plastic frame window.

The strip form of the packaged circuits is completed in the step represented by block 94 in which a second cap is applied in the window 116 on the other side of the plastic frame (as shown in FIG. 11), thereby sealing the integrated circuit chip carrying spider assembly between the two caps with the chip carrying spider assembly being totally surrounded by the sealant.

II. FABRICATION AND DESCRIPTION OF THE INTEGRATED CIRCUIT CHIP OF FIG. 2

Figure 2:
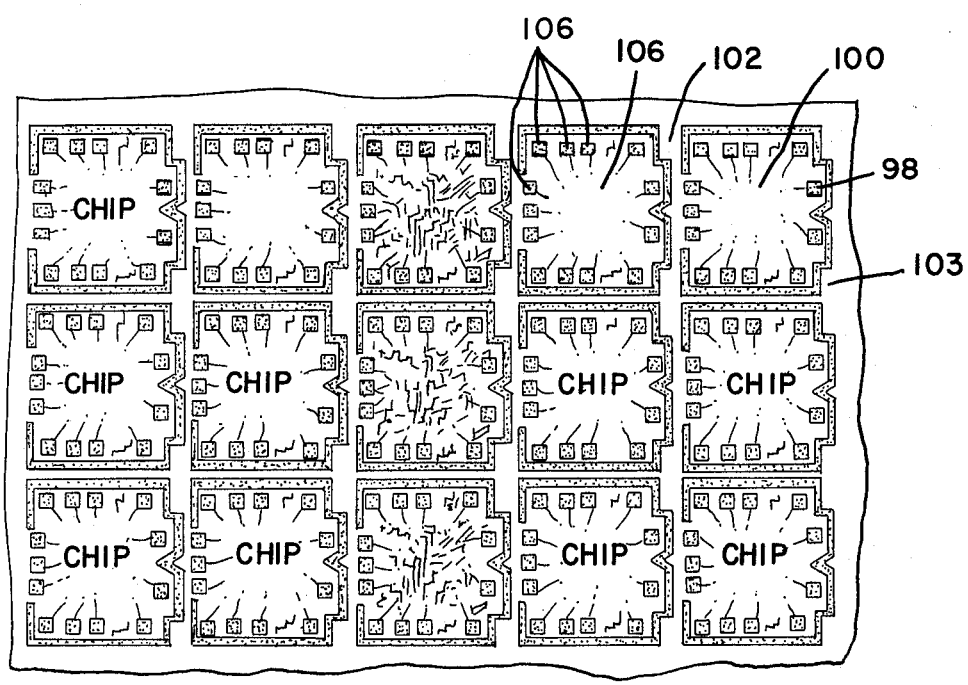
FIG. 2 shows a sheet of integrated circuit chips which are formed by well known optical-chemical techniques.

The method of making the chips in sheet form as shown in FIG. 2 is well known in the art. In FIG. 2 there are shown twelve integrated circuit chips arranged in a three by four matrix. These chips are made by optical-chemical means and each contains many thousands of transistors, diodes, resistors, capacitors and other circuit components to form a complete and complex electronic logic system. In any given sheet of integrated circuit chips, such as shown in FIG. 2, all of the chips are usually identical. Around the edge of each chip are positioned a series of terminal pads, such as terminal pads 106 of chip 101, which are connected to the internal circuitry of the chip and provide a means for connection to a circuit external of the chip. One method of making the chips of FIG. 2 is described in a publication entitled "Integrated Circuit Engineering, Basic Technology ICE" published by Integrated Circuit Engineering, 6710 E. Camelback Road, Suite 211, Scottsdale, Ariz., copyrighted in 1975, and incorporated by reference herein as a part of this specification.

III. FABRICATION AND DESCRIPTION OF THE SPIDER ASSEMBLY OF FIG. 3

Figure 3:
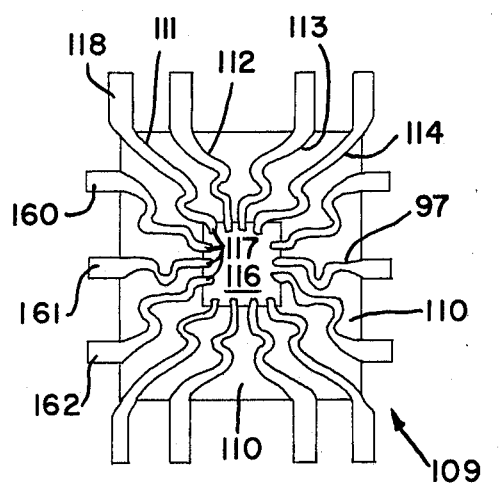
FIG. 3 shows a typical spider assembly configuration which holds the integrated circuit chip within its inner window and thereby forms a supporting element between the integrated circuit chip and a lead frame.

To employ the integrated circuit chips in a given application they are first separated from the sheet of chips of FIG. 2 and mounted on an interconnecting means commonly known in the art as a spider assembly. Such a spider assembly 109 is shown in FIG. 3 and consists of a series of conductive paths, such as paths 111, 112, 113 and 114, formed on an insulative substrate 110 which has a square-shaped window 116 formed in the center thereof. In one method of fabricating spider assemblies, the various conductive circuit paths 111 through 114 are stamped from a solid sheet of metal which is then secured by appropriate bonding means to a substrate 110. In its original stamped form the spider assembly has metallic links (not shown in FIG. 3) interconnecting the conductive paths to retain said conductive paths together in a fixed relationship until the spider assembly is mounted on the substrate 110. The interconnecting supporting links are then removed from the spider assembly 109 leaving the electrically separate circuit paths shown in FIG. 3 mounted upon the substrate 110. It can be seen from FIG. 3 that each of the conductive paths, such as path 111, has one end 117 extending into the window space 116 and the other end 118 extending from the outside edge of substrate 110.

Figure 4:
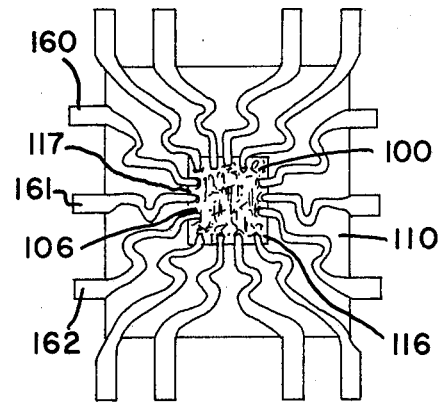
FIG. 4 shows a spider assembly upon which is mounted an integrated circuit chip.

FIG. 4 shows the spider assembly of FIG. 3 with an integrated circuit chip 100 mounted in the window 116 of substrate 110. The inner, converging ends, such as ends 117, of the spider assembly circuit paths, such as circuit path 161, extending into the window 116 are positioned around the perimeter thereof so as to be coincident with the terminals 106 formed around the edge of an integrated circuit chip 100 (see FIG. 2). Thus, when the circuit chip 100 is mounted into window 116 of connector 110 of FIG. 3 the terminals 106 of the integrated circuit chip 100 will, in fact, overlay the various extensions 117 of the spider assembly conductive paths of FIG. 3 and can be bonded thereto by suitable bonding means, such as the application of heat or ultrasonic energy. It should be noted that those terminals, such as the ends 117 of the spider assembly of FIG. 3 which extend into the window 116 are plated with a suitable metal, such as gold or silver, which will bond with the various terminal pads 106 of the chip 100, also preferably plated with a noble metal such as gold or silver. The terminal pads 106 of chip 100 are usually raised above the surface of the chip 100 to facilitate contact between said terminals and the connecting leads 117 of the spider assembly of FIG. 3.

Sectional views of the spider assembly and the integrated circuit chip mounted thereon are shown in FIGS. 9, 10 and 11, which will be described later herein.

The techniques for bonding the terminals 106 of the integrated circuit chips to the terminals 117 of the spider assembly are well known in the art and are described in detail in an article entitled "Special Report: Film Carriers Star In High Volume IC Production" appearing on page 61 of the Dec. 25, 1975, edition of Electronics, published by McGraw Hill and incorporated herein by reference as a part of this specification.

The next step in the process is to secure the chip bearing spider assembly onto the plastic encapsulated lead frames. The method of fabricating the lead frames in strip form and encapsulating them with plastic will be described next.

IV. FABRICATION OF PLASTIC ENCAPSULATED LEAD FRAME STRUCTURES AND THE ENCAPSULATION THEREOF WITH PLASTIC AS SHOWN IN FIG. 5

Referring now to FIG. 5 there is shown a lead frame 123 stamped from a single piece of flat metal stock. The lead frame 123 comprises a plurality of lead frame terminals 125 through 138, all of which extend into the inner window 116 formed by the plastic encapsulation 150. In the blank form, as originally stamped from the metal stock, short linking elements, such as elements 140 and 141 extend between adjacent terminals, such as terminals 146, 147 and 148, in order to maintain the spacing and relative position of the terminals until completion of the circuit being packaged. In other words, the connecting elements 140 and 141 are temporary supporting structures employed to maintain the individual lead frame terminals in their desired positions with respect to one another until the plastic encapsulation 150 is formed therearound as shown in FIG. 5, the plastic then assuming the function of holding said lead frame terminals in their proper positions relative to each other.

It is to be noted that after completion of the unit, that is following the final placing of the caps on either side of the window 116, elements 140 and 141 are cut away by appropriate cutting means, leaving the individual circuit packages separated one from the other, and also the lead frame terminals of each circuit package electrically separated one from the other.

The encapsulating of the stamped lead frame by plastic 150 is accomplished by one of several well known techniques or methods. One such method is accomplished by an apparatus known as a Dynacast molding machine which is described in detail in Canadian Pat. No. 932,917 filed Sept. 4, 1973, by John H. Lauterback and entitled "Injection Molding Machine," and incorporated herein as a part of this specification. Generally speaking the Dynacast molding machine is a continuous process in that the lead frame is taken from a take-off reel and passed through the Dynacast molding machine in an intermittent stop and start motion. More specifically, a first group of lead frame assemblies (in strip form) are positioned in the work area of the Dynacast molding machine and plastic is then extruded in and around such lead frame assemblies in the desired configuration which leaves a window, such as window 116, present near or at the center of each lead frame configuration. As discussed above, the lead frame terminals extend into the window area. Thus, the converging ends 154, 155, 156 and 157 of terminals 126, 127, 128 and 129 extend into the window area 116.

Upon completion of encapsulating the first group of lead frame assemblies with plastic in the work area of the Dynacast machine, the strip of lead frame assemblies is advanced to move a new group of lead frame assemblies (in strip form) into the work area of the machine and the plastic encapsulating process is repeated. The lead frame of each succeeding packaged circuit is integrally joined with the lead frame of the previously completed group of packaged circuits.

Because the plastic used for the encapsulation does not come in contact with the integrated circuit chip, it is possible to use fast setting plastics which would be harmful if they came into physical contact with the integrated circuit chip. There are many presently available fast setting plastics which are suitable and which will enable the continuous encapsulation of the reel of lead beam frames. Examples of such fast setting plastics are nylons and polyphenylene sulfide.

V. METHOD OF SECURING A SPIDER ASSEMBLY HAVING AN INTEGRATED CIRCUIT CHIP MOUNTED THEREON ONTO THE ENDS OF THE TERMINALS OF A LEAD FRAME

FIG. 6 is similar to that of FIG. 5 except that fewer lead frame terminals are shown and the spider assembly 109 containing the integrated circuit chip 100 thereon is shown as being secured to the inner ends of the lead frame terminals. More specifically, the external or outer terminals, such as terminals 160, 161, 162 of the spider assembly are shown as being connected to the divergent inner ends, such as ends 155, 156 and 157 of the lead frame terminals 126, 127 and 128.

The external spider leads, such as leads 160, 161 and 162, are usually affixed to the inner ends of the beam leads by metallic bonding means, such as thermal compression bonding. Both the external leads of the spider and the inner leads of the beam leads can be copper or coated with a noble metal, such as gold or silver. Copper presents certain problems, particularly with thermal compression bonding techniques. Accordingly, noble metals are more frequently employed.

The apparatus and techniques employed for bonding the spider terminals onto the inner ends of the beam leads are well known in the art and essentially comprise heated elements which are brought, with great precision, into contact with the overlaid external spider terminals and the inner ends of the lead frame terminals and fuse together the copper or alternatively gold or silver plating on the ends of such overlaid terminals.

FIG. 7 shows the reverse side of the structure of FIG. 6. The inner ends of the spider assembly can be seen to be affixed to the raised terminal pads located on the edge of the integrated circuit chip 100. For example, the inner end of the spider conductive path 160 can be seen to be secured to the raised terminal pad 98 of chip 100.

VI. ASSEMBLY OF THE BOTTOM CAP, THE SEALANT AND THE TOP CAP INTO THE WINDOW SPACE DEFINED BY THE ENCAPSULATING PLASTIC

Referring now to FIGS. 8, 9 and 10 there are shown sectional views of the structure of FIG. 8 along plane 10—10 during its assembly, with FIG. 10 showing the sectional view of the completed structure.

In FIG. 8 the integrated circuit chip 100 is shown mounted on the spider assembly 109. More specifically, the spider assembly leads, such as leads 97 and 161 are mounted on the spider substrate 110 and the integrated circuit chip 100 is secured to the inner ends of the spider assembly terminals in the manner discussed hereinbefore, namely, by being bonded to the raised circuit pads on the edge of integrated circuit chip 100.

The outer ends of the spider assembly conductive paths are in turn secured or bonded to beam leads, such as beam leads 170 and 156, which are sandwiched in-between the encapsulating plastic 150. It is to be understood that the plastic encapsulating means 150 terminates at edges 171 on the left hand side thereof in FIG. 8, and at edges 172 on the right hand side thereof in FIG. 8, to form the window 116 in FIGS. 3 and 5.

A cap 173 of metal or plastic is glued or press fitted into the window defined by the two edges 171 and 172 of the encapsulating plastic 150 and also the two other edges (not shown in FIG. 8) which are perpendicular to edges 171 and 172, to assume the final position shown in FIG. 9. With the cap 173 installed there is formed a well or pocket out of window space 116 which contains the spider assembly 109 and the chip 100 mounted thereon, as well as the inner ends of the lead frame terminals, such as terminals 135 and 127. The next step in the process is to fill the window space or pocket 116 with a suitable insulating and sealing material such as, for example, a silicone gel designated generally by reference character 174 in FIG. 9. Next, a second cap 175, also of a metallic or plastic material, is glued, bonded or press fitted in the direction of arrow 176 over the window space 116 to completely enclose said window space 116. Both the cap 173 and the cap 175 are stamped from metal or molded in plastic and have a base which does not mate perfectly with the window space 116 in the plastic frame 150. To accommodate such mating deficiencies the second cap 175 is forced into the window space 116 with sufficient force to force the gel-like sealant into any cracks or spaces between the edges of the caps 173 and 175 and the plastic frame forming the window space 116 to make the seal therebetween sufficiently perfect to prevent moisture and other atmospheric contaminants from entering into the area to thereby avoid corrosion and failure of the IC chip.

The silicone gel 174 employed to fill up the window space 116 has a low level of molecular cross-linking and therefore has very few pores through which moisture can pass to reach the surface of the integrated circuit chip 100. Thus, the use of the silicone gel provides a virtual waterproof encapsulation of the integrated circuit chip. The two caps 173 and 175 function to retain such silicone gel within the window space 116 and completely encapsulating the integrated circuit chip 100.

The nearly completed structure is shown in FIG. 10. The remaining processing of the packaged circuit consists of removing the connecting links, such as links 140 and 141 of FIG. 6 from between the lead frame terminals which will separate each completed packaged circuit one from the other, so that they no longer will be in a continuous strip form and will also electrically isolate each of the lead frame terminals. Such separated lead frame terminals of each of the packaged circuits can now be bent with the external ends thereof all oriented in the same direction and insertable into appropriate receptacles, such as for example, appropriate receptacles mounted or formed in a printed circuit board.

A modification of the process and product by process described hereinbefore employs the use of two spiders, each bearing a separate integrated circuit chip, and mounted on opposite sides of the lead frame terminals, or alternatively two circuit chips mounted on opposite sides of the same spider. The principal change in the process involves the addition of the necessary steps to bond a second integrated circuit chip on a second spider terminal or on the opposite side of the spider terminal to which a first chip is secured. The spider assembly, or assemblies, including the two integrated circuit chips are then inserted into the lead frame plastic window and secured to the inner terminals of the lead frame in substantially the same manner as described hereinbefore. A first cap is press fitted, or otherwise secured, over the window on one side of the plastic frame, the space defined by the window then filled with a sealant substantially impervious to water vapor and a second cap is then press fitted over the window on the other side of the plastic frame. The integrated circuit chips are separated from each other by the thickness of the spider terminals and the height of the conductive bumps or pads on the circuit chips. As in the process described above the caps can be either plastic or metal.

VII. MODIFIED METHOD EMPLOYING A LEAD FRAME STRUCTURE WHICH INCLUDES A REFERENCE POTENTIAL PLANE UPON WHICH THE INTEGRATED CIRCUIT CHIP CAN BE MOUNTED AND A DISCUSSION OF TYPICAL PRODUCTS MADE THEREWITH

Referring now to FIG. 11 a spider assembly 109 with a circuit chip 100 mounted thereon is shown being removed from a strip 200 of such spider assemblies, each with a circuit chip mounted thereon. The space 202 represents a prior removal of such spider assembly and the blank element 203 represents the next spider assembly with chip to be removed from the strip 200.

The spider assembly 109 with the chip 100 is to be mounted on the convergent terminals 207 of the lead frame structure 204, which terminals 207 extend within the window 198 formed by the plastic frame 205.

Also present within the plastic frame 205 is a ground reference plate 208 which is formed from the blank lead frame metal strip 204 and which has a lead 209 extending through the plastic frame 205 and which can be later connected to a suitable reference potential, usually ground.

It is to be noted that the particular configuration of the lead frame structure 204 is somewhat different from the configuration of the lead frame structure of FIG. 6 in that the convergent terminals 207 originate on all four external sides of the plastic frame 205 and are designated generally by reference characters 206. The lead frame terminals of FIG. 6 originate inwardly essentially from two sides of the lead frame strip.

Figure 12:
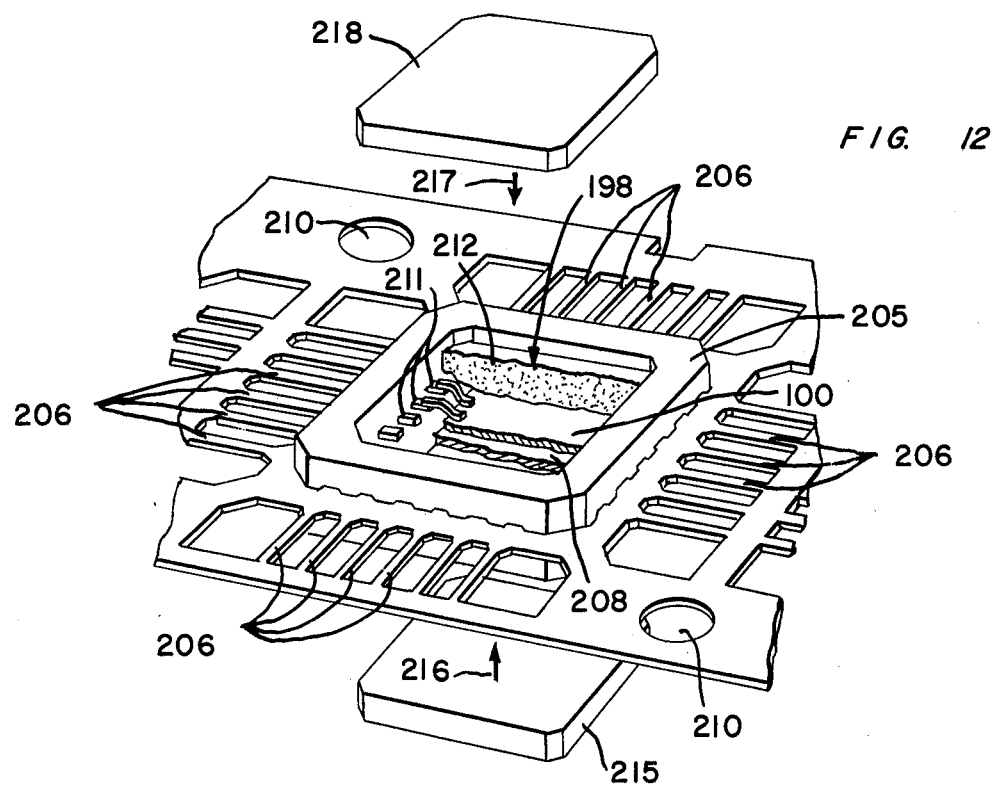
FIG. 12 is a perspective view of the partially assembled structure with the covers removed.

In FIG. 12 the spider element 109 with the circuit chip 100 thereon is shown within the window space formed by plastic frame 205 in a partially broken-away view. Said circuit chip 100 is shown mounted on the reference potential plate 208, also illustrated in a broken-away manner. The sealant 212 is depicted in a broken away fashion covering the chip 100 and the plate 208. The ends 211 of lead frame conductor 206 are seen to extend within the window space 198 and support spider terminals 109.

Covers 215 and 218 are shown respectively below and above the structure. It is to be understood that cover 215 is in fact press-fitted into the plastic frame 205 from the bottom prior to the insertion of sealant 212 into the window space 198. Cover 215 is shown in its non-assembled position merely to indicate its presence in the structure. The upper cover 218 is inserted into window space 198 as the final step in the assembly of the product.

It is to be understood that removal of certain portions of the lead frame structure and the forming of the lead frame termials 206 into a desired configuration is performed later, depending upon the application of the assembly.

Figure 13:
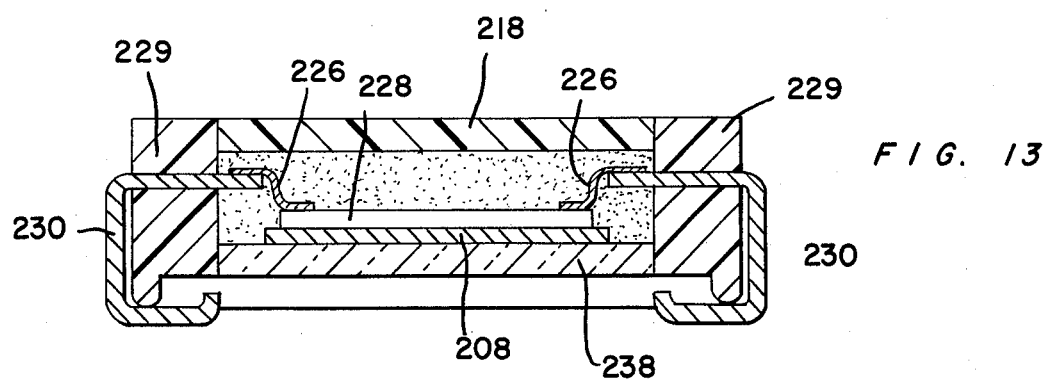
FIG. 13 is a sectional view of a completed product made by the process of the invention employing the reference potential plane formed from the lead frame material with a single chip mounted on one side thereof.

In the sectional view of FIG. 13 a single chip 228 is mounted upon the reference potential plate 208. A spider assembly 226 connects the chip 228 to lead frame terminals 230 which extend through the plastic frame 229. In the particular assembly configuration of FIG. 13 the upper cap 218 preferably is of plastic. The bottom cap 238 can be either of plastic or metal but preferably is of metal to further improve the ground plane characteristics of the assembly. The cavity between the two caps 218 and 238 is filled with a moisture proof sealant as discussed hereinbefore.

Figure 14:
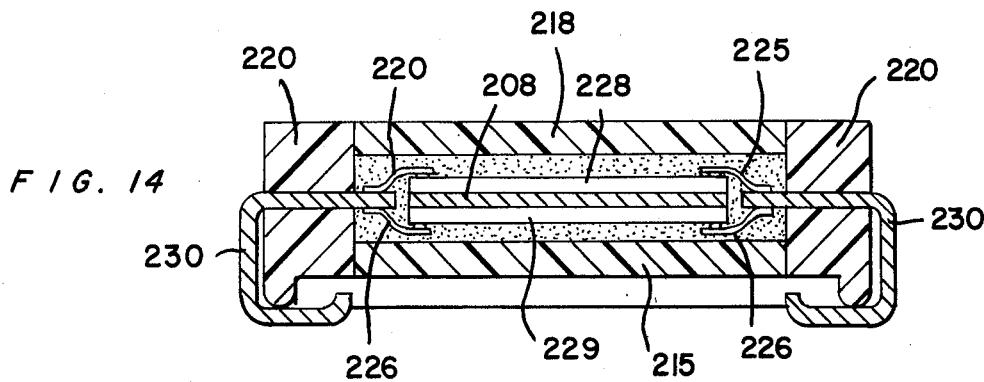
FIG. 14 is a sectional view of a product made by the process of the invention employing the reference potential plane with integrated circuit chips mounted on either side thereof.

In the sectional view of FIG. 14 a pair of integrated circuit chips 228 and 229 are positioned upon opposite surfaces of reference potential plane 208 which, as discussed above, is formed from the blank lead frame strip of metal. A pair of spider assemblies 225 and 226 connect the two circuit chips 228 and 229 to the lead frame terminals 230 which extend through plastic frame 220. Both caps 218 and 215 can be either plastic or metal although in the specific configuration of FIG. 14 they are preferably plastic.

It is to be understood that the invention shown and described herein, and particularly the order of the steps of the process, can be altered by one skilled in the art without departing from the spirit or scope of the invention.

What is claimed is:

1. An assembly line method of forming a strip of iterative packaged circuits each containing an integrated circuit chip hermetically sealed therein and connected to first ends of the conductive paths of a lead frame structure by a spider assembly and comprising the steps of:
    encapsulating in plastic a portion of each lead frame structure in a frame-like configuration forming a window space with said first ends of said lead frame conductive paths extending into said window space;
    mounting an integrated circuit chip on each spider assembly;
    mounting a spider assembly with said integrated circuit chip mounted thereon on the first ends of said lead frame conductive paths extending into each window space;
    press fitting a first cap in each window space on a first side of said plastic frame;
    filling each window with a gel type sealant characterized by imperviousness to the passage of gas or moisture therethrough; and
    press fitting a second cap in said each window space on the second side of said plastic frame with sufficient force to force said gel type sealant into any space between said first and second caps and said plastic frame.

2. An assembly line method of assembling together integrated circuit chips, spider assemblies and a strip of iterative lead frame structures each having a plurality of conductive paths to form a strip of iterative packaged circuits each containing an integrated circuit chip which is hermetically sealed therein and which is connected to first ends of the lead frame conductive paths by said spider assembly and further with the second ends of the lead frame conductive paths extending from said package, and comprising the steps of:
    encapsulating in plastic the portion of each lead frame structure between the first and second ends of the conductive paths thereof in a frame-like configuration which defines a window space into which the first ends of said lead frame conductive path extend;
    mounting an integrated circuit chip on each spider assembly;
    mounting a spider assembly with an integrated circuit chip mounted thereon on the first ends of said lead frame conductive paths extending into each window space;
    covering each window space on a first side of said plastic frame with a first cap which is press fitted into said window space;
    filling each window space with gel-like sealant which is virtually impervious to the passage of gas or moisture therethrough; and
    covering said window space on the second side of said plastic frame with a second cap which is press fitted into said window space to force said gel-like sealant into any space existing between the edges of said first and second caps and said plastic frame.

3. A method of forming a strip of iterative packaged circuits each containing an integrated circuit chip hermetically sealed therein and connected to first ends of the conductive paths of a lead frame by a spider assembly and comprising the steps of:
    encapsulating in plastic a portion of each lead frame structure in a frame-like configuration forming a window space with first ends of said lead frame conductive paths extending into said window space;
    mounting a spider assembly having an integrated circuit chip mounted thereon on the first ends of said conductive paths extending into each window space;
    press fitting a first cap in each window space on a first side of said plastic frame;
    filling each window with a gel type sealant characterized by imperviousness to the passage of moisture therethrough; and
    press fitting a second cap in said each window space on the second side of said plastic frame with sufficient force to force said gel type sealant into any space between said first and second caps and said plastic frame.

4. The method of combining a circuit carrying substrate, spider assemblies and a strip of iterative lead frame structures together to form a strip of iterative unitary packaged circuits in which the substrate of each package is hermetically sealed therein with first ends of the lead frame conductive paths extending from said package, and comprising the steps of:

encapsulating in plastic that portion of each of said lead frame structures which lies between the first and second ends of the conductive paths of each lead frame structure in a configuration defining a window space into which the second ends of said lead frame conductive paths extend;

mounting a circuit carrying substrate on each of said spider assemblies;

mounting a spider assembly with a circuit carrying substrate mounted thereon on the second ends of said lead frame conductive paths extending into each window space;

press fitting a first cover over a first side of said window space;

filling said window space with a gel type sealant which is virtually impervious to the passage of moisture therethrough; and press fitting a second cover over the second side of said window space with sufficient force to force said gel type sealant into any space between said first and second caps and said plastic frame.

5. The method of fabricating a strip of hermetically sealed integrated circuit chips with externally extending terminals attached thereto and comprising the steps of:

forming a continuous strip of iterative lead frame structures with first free ends of the conductive paths of each of said lead frame structures terminating about the edge of an open area and with the other ends of each of said lead frame conductive paths extending outwardly of said open end;

encapsulating that portion of each of said iterative lead frame structures between the first and seconds ends of each lead frame conductive path to form a window around said open area and with the first and second ends of said lead frame conductive paths extending out of said plastic;

forming spider assemblies each having a plurality of separate conductive paths each with a first end and a second end;

mounting an integrated circuit chip upon each of said spider assemblies with the terminals of said integrated circuit chip secured to the first ends of said separate conductive paths of said each spider assembly;

securing the second ends of the conductive paths of at least one of said spider assemblies to the first ends of the conductive paths of one of said lead frames;

press fitting a first cap over a first side of said window;

filling the space defined by said first cap and the edges of the plastic around said window with a gel type sealant; and press fitting a second cap over a second side of said window.

6. As assembly line method of assembling together circuit bearing substrates, spider assemblies and a strip of iterative lead frame structures each having a plurality of conductive paths to form a strip of iterative packaged circuits each containing a substrate which is hermetically sealed therein and which is connected to first ends of the lead frame conductive paths by said spider assembly and comprising the steps of:

encapsulating in an insulative material the portion of each lead frame structure in a frame-like configuration which defines a window space into which the first ends of said lead frame conductive path extend;

mounting a substrate on each spider assembly;

mounting at least one spider assembly with a substrate mounted thereon on the first ends of said lead frame conductive paths extending into each window space;

covering each window space on a first side of said frame-like configuration with a first cap which is press fitted into said window space;

filling each window space with a gel-like sealant substantially impervious to the passage of gas or moisture therethrough; and covering said window space on the second side of said frame-like configuration with a second cap which is press fitted into said window space to force said gel-like sealant into any space existing between the edges of said first and second caps and said frame-like configuration.

7. A method of forming a strip of iterative packaged circuits each containing a circuit bearing substrate hermetically sealed therein and connected to first ends of the conductive paths of a lead frame by a spider assembly and comprising the steps of:

encapsulating in plastic a portion of each lead frame structure in a frame-like configuration forming a window space with first ends of said lead frame conductive paths extending into said window space;

mounting a spider assembly having one of said circuit bearing substrates mounting thereon onto the first ends of said conductive paths extending into each window space;

covering each window space on a first side of said plastic frame with a first cover which is press fitted into said window space;

filling each window with a gel-like sealant characterized by imperviousness to the passage of moisture therethrough; and covering said each window space on the second side of said plastic frame with a second cover which is press fitted into said window space to force said gel-like sealant into any space existing between the edges of said first and second caps and said frame-like configuration.

8. A packaged circuit comprising:

a lead frame comprising a plurality of lead frame conductors having first and second ends;

a plastic frame defining an opening therein and encapsulating a portion of each of said conductors with first ends of said conductors extending into said opening and with the second ends of said conductors extending externally from said plastic frame; and a spider assembly comprising conductive strips with circuit element means mounted on first ends of said conductive strips within said opening and having second ends of said conductive strips secured to the first ends of said lead frame conductors; and first and second cover means enclosing opposite sides of said space and with the space therebetween filled with an insulative gel-like sealant encapsulating said circuit element and being substantially impervious to the passage of water vapor therethrough;

said packaged circuit being constructed by the steps of:

encapsulating a portion of the lead frame conductors in a plastic frame configuration forming an opening therein with said first ends of said lead frame conductors extending into said opening;

mounting a spider having a circuit element secured thereon on the first ends of said lead frame conductors;

press fitting a first cover on a first side of said plastic frame;

filling said opening with said gel-like sealant; and press fitting a second cover in said opening on the second side of said plastic frame with sufficient force to force said gel type sealant into any space between said first and second caps and said plastic frame.

9. A strip of packaged circuits comprising sealed circuit elements each comprising:

a lead frame comprising a plurality of first lead frame terminals;

a plastic frame encapsulating a portion of said first lead frame terminals and defining a space therewithin with first ends of said terminals extending externally from said plastic frame and with second ends of said terminals extending into said space; and said plastic frames being of a fast setting plastic;

a spider structure bearing at least one circuit element positioned within said space and having conductive elements with first ends thereof secured to the second ends of said lead frame terminals and positioned within said space;

first and second cover means enclosing opposite sides of said space;

said space being filled with a sealant encapsulating said circuit element and being substantially impervious to the passage of air therethrough;

said packaged circuit being constructed by the steps of:

moving a strip of iterative lead frames into and out of successive work stations;

encapsulating in a plastic frame the middle portion of the leads of each lead frame of a strip of iterative lead frames at a first of said work stations with first ends of the leads of each strip extending into the space defined by said plastic frame;

mounting an array of second terminals bearing a circuit element on the first ends of the lead frame terminals within said space at a second work station;

press fitting a first cover over said space on a first side of said plastic frame at a third work station;

filling said space with an air impervious sealant; and press fitting a second cover over said space on a second side of said plastic frame with sufficient force to force said air impervious sealant into any space between said first and second covers and said plastic frame.

10. A packaged circuit comprising at least one sealed element and formed by an assembly line process comprising the steps of:

encapsulating in a plastic frame of fast setting plastic the middle portion of the leads of successive ones of an iterative strip of lead frames with first ends of the leads of each lead frame extending into the opening defined within the plastic frame;

mounting at least one spider assembly carrying said circuit element on said first ends of the leads of the lead frame extending into each of said openings;

securing a first cover over each of said openings on a first side of said plastic frame;

filling each of said openings and immersing the circuit element therein with a moisture proof sealant; and press fitting a second cover over each of said openings on the second side of said plastic frame with sufficient force to force said moisture proof sealant into any space between said first and second covers and said plastic frame.

11. A packaged circuit comprising:

a lead frame structure comprising a plurality of lead frame conductors having first and second ends with said second ends converging towards each other and defining an open area between the ends thereof and with a plate in said open area;

a plastic frame of fast setting plastic defining an opening therewithin and encapsulating a portion of each of said lead frame conductors with first ends of said lead frame conductors extending into said opening and with the second ends of said lead frame conductors extending externally from said plastic frame; and at least one spider assembly comprising conductive strips with circuit element means mounted on first ends of said conductive strips within said opening and having second ends of said conductive strips secured to the first ends of said lead frame conductors;

said circuit element means being mounted upon said plate;

first and second cover means enclosing said opening on opposite sides of said plastic frame and with the space between said first and second cover means filled with a moisture-proof sealant which encapsulates said circuit element and which fills any gaps between the edges of said first and second cover means and said plastic frame;

said packaged circuit being constructed by the steps of:

encapsulating a portion of the lead frame conductors in a plastic frame configuration forming an opening therewithin with said first ends of said lead frame conductors extending into said opening;

mounting at least one spider assembly having a circuit element secured thereon on the first ends of said lead frame conductors;

press fitting a first cover on a first side of said plastic frame;

filling said opening with said moisture-proof sealant; and press fitting a second cover in said opening on the second side of said plastic frame with sufficient force to force said moisture proof sealant into any space between said first and second covers and said plastic frame.

12. A packaged circuit comprising sealed circuit element means and formed by an assembly line process comprising the steps of:

encapsulating in a plastic frame of fast setting plastic the middle portion of the leads of successive ones of an iterative strip of lead frames with first ends of the leads of each lead frame extending into the opening defined within said plastic frame and with a flat metal plate having two major surfaces and formed integrally with said strip of lead frames and occupying a portion of said opening;

mounting at least one spider assembly each carrying said circuit element means on said first ends of the leads of the lead frame extending into each of said openings with said circuit element means being mounted upon at least one major surface of each of said flat metal plates;

securing a first cover over each of said openings on a first side of each of said plastic frames;

filling each of said openings and immersing the circuit element means therein with a moisture proof sealant; and press fitting a second cover over each of said openings on the second side of each of said plastic frames with sufficient force to force said moisture proof sealant into any space between said first and second covers and said plastic frame.

13. A method of forming a strip of iterative packaged circuits each containing at least one integrated circuit chip hermetically sealed therein and connected to first ends of the conductive paths of a lead frame by spider assembly means and comprising the steps of:

encapsulating in fast setting plastic a portion of each lead frame structure in a frame-like configuration forming a window space therewithin with first ends of said lead frame conductive paths extending into said window space and a metal plate positioned within said window space, and with a conductor extending from said metal plate to the outside of said plastic frame-like configuration;

mounting the terminals of at least one spider assembly means having an integrated circuit chip mounted thereon on the first ends of said conductive paths extending into each window space and with the integrated circuit chip mounted upon said metal plate;

mounting a first cover in each window space on a first side of said plastic frame;

filling each window space with a sealant characterized by imperviousness to the passage of moisture therethrough; and press fitting a second cover in said each window space on the second side of said plastic frame with sufficient force to force said sealant into any space between said first and second covers and said plastic frame.

* * * * *